(12) United States Patent
Chen et al.

(10) Patent No.: US 8,456,211 B2
(45) Date of Patent: Jun. 4, 2013

(54) SLEW RATE CONTROL CIRCUIT AND METHOD THEREOF AND SLEW RATE CONTROL DEVICE

(75) Inventors: Chin-Yang Chen, Keelung (TW); Jian-Wen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 267 days.

(21) Appl. No.: 12/778,132

(22) Filed: May 12, 2010

(65) Prior Publication Data

US 2011/0279158 A1 Nov. 17, 2011

(51) Int. Cl.
*H03K 5/12* (2006.01)
(52) U.S. Cl.
USPC .......................................................... 327/170
(58) Field of Classification Search
USPC .................................... 327/170, 172
See application file for complete search history.

(56) References Cited

U.S. PATENT DOCUMENTS

| 7,019,551 | B1 | 3/2006 | Biesterfeldt |
| 2004/0104743 | A1* | 6/2004 | Honda .............................. 326/81 |
| 2007/0290730 | A1* | 12/2007 | Dai et al. ....................... 327/175 |
| 2008/0164922 | A1* | 7/2008 | Yun et al. ....................... 327/160 |

* cited by examiner

*Primary Examiner* — Daniel Rojas
(74) *Attorney, Agent, or Firm* — Jianq Chyun IP Office (57) ABSTRACT

A slew rate control circuit is provided. The slew rate control circuit includes at least one switch and an inverter. A first end of the switch is coupled to a power terminal. A toggle end of the switch is coupled to a first control terminal. A second end of the switch is coupled to an output terminal. An output end of the inverter is coupled to the output terminal. An input end of the inverter is coupled to an input terminal. A voltage at the first control terminal conducts the switch to reduce the slew rate when a large voltage variation occurs at the output terminal. A method of controlling a slew rate and a slew rate control device are provided.

10 Claims, 5 Drawing Sheets

SLEW RATE CONTROL CIRCUIT AND METHOD THEREOF AND SLEW RATE CONTROL DEVICE

BACKGROUND OF THE INVENTION

The invention relates to an electronic circuit, and more particularly, to a slew rate control circuit, a method of controlling a slew rate, and a slew rate control device.

DESCRIPTION OF RELATED ART

To meet timing requirements, the integrated circuits that provide output signals employ some form of "slew rate" control. "Slew rate" is a rate of an output voltage changes in a time period, i.e. Slew rate is defined as dv/dt, for example, the rate of the output voltage changes in the transition time when output voltage changes from a "low" level to a "high" level, or from a "high" level to a "low" level. Some devices have attempted to control the slew rate by restricting the range of process variables, voltage and temperature. Other devices attempt to control the slew rate by turning on/off the stages to provide the output signal. That is, an output signal from a particular integrated circuit device may be driven by two or more output stages, and the two or more stages will be turned on in sequence to control the slew rate. The universal serial bus drivers use a capacitive feedback from the output to the pre-driver stage. These devices attempt to use the gain of the output stage to make the capacitance at the pre-driver node appear to be very large. In essence, this technique attempts to desensitize the output driver to variations in the output capacitance, allowing greater variation of the output capacitance without undue effect on the slew rate.

However, variation in the output capacitance is not the only factor that affects the slew rate. Variations in manufacturing process parameters, voltage levels in the integrated circuit device and temperature at which the device is operating all contribute to variations in the slew rate at the output stage. In particular, in light of the many factors affecting slew rate, as the load capacitance being driven by the output circuit and manufacturing process parameters vary through a permitted range, the slew rate of the output signal may fall outside the range required by an applicable specification.

SUMMARY OF THE INVENTION

The invention is directed to a slew rate control device. The slew rate control device is adapted for an audio amplifier. The audio amplifier comprises a pre-driver and a power stage. The slew rate control device comprises means for reducing a slew rate of an output terminal of the pre-driver to slowly turn off the power stage when a voltage variation occurring at the output terminal exceeds a predetermined voltage variation.

According to an embodiment of the invention, the means for reducing the slew rate includes a slew rate control circuit. The slew rate control circuit includes at least one switch and an inverter. The first end of the switch is coupled to a power terminal. A toggle end of the switch is coupled to a first control terminal. The second end of the switch is coupled to an output terminal. An output end of the inverter is coupled to the output terminal. An input end of the inverter is coupled to an input terminal. A voltage at the first control terminal conducts the switch to reduce the slew rate when the voltage variation occurring at the output terminal exceeds the predetermined voltage variation.

The invention is directed to a method of controlling a slew rate with a slew rate control circuit including an inverter and at least one switch. The switch is coupled between a power terminal and an output terminal. An output end of the inverter is coupled to the output terminal. An input end of the inverter is coupled to an input terminal. The method of controlling a slew rate with a slew rate control circuit includes providing a voltage at a toggle end of the switch to conduct the switch to control the slew rate when a voltage variation occurring at the output terminal exceeds a predetermined voltage variation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
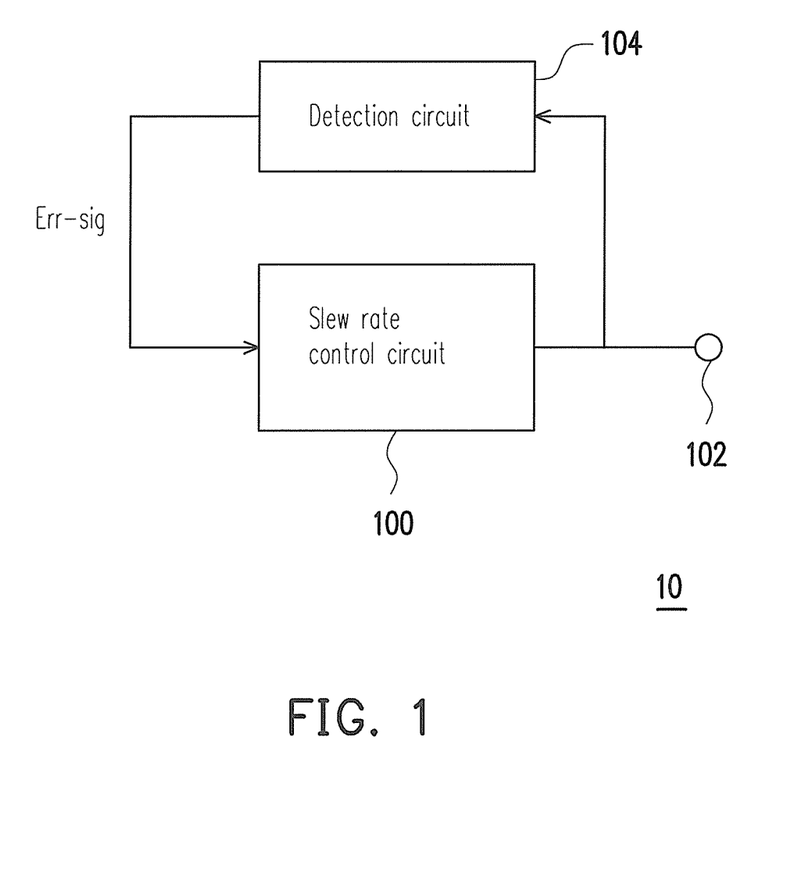
FIG. 1 shows a block diagram of a slew rate control device according to the embodiment of the invention.

FIG. 1 shows a block diagram of a slew rate control device according to the embodiment of the invention. Referring to FIG. 1, the slew rate control device 10 comprises a detection circuit 104 and a slew rate control circuit 100. When the voltage variation occurring at the output terminal 102 exceeds the predetermined voltage variation, a detection signal Err_Sig is generated by the detection circuit 104. The slew rate control circuit 100 reduces the slew rate of the output terminal 102 according to the detection signal Err_Sig.

The slew rate is defined as dv/dt, wherein dv represents the differential value the output voltage in the time difference dt. The slew rare is the output voltage variation. For example, when the output voltage at the output terminal 102 is pulled up from $V_{o1}$ to $V_{o2}$ ($V_{o1}<V_{o2}$), or pushed down from $V_{o2}$ to $V_{o1}$ in the time difference dt, the slew rate is ($V_{o2}-V_{o1}$)/dt. If the voltage values $V_{o1}$ to $V_{o2}$ are fixed, the object of the slew rate control device 100 is to increase the time difference dt. Therefore, the reduction of the slew rate of the output terminal 102 may be achieved by controlling the channel size of the output transistors, the gate voltage of the output transistors or adding a diode for reducing the current through the output terminal 102, so as to increase the time difference of the transition of the output voltage.

The detail of the slew rate control circuit 100 will be described below. It is noted that the implementation of the slew rate control device is not limited to the utilization of the slew rate control circuit, and may be achieved by any configuration.

Figure 2:
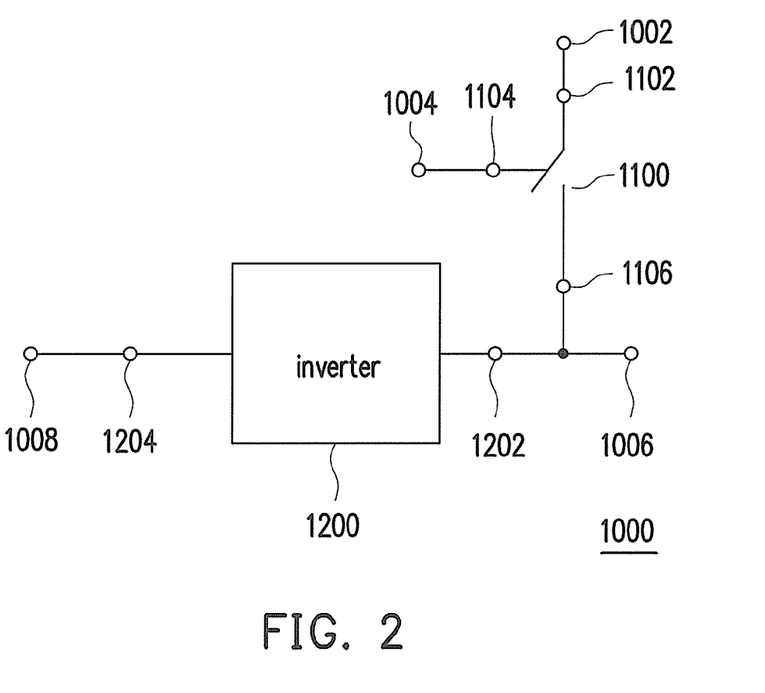
FIG. 2 shows a block diagram of a slew rate control circuit according to the embodiment of the invention.

FIG. 2 shows a block diagram of a slew rate control circuit according to the embodiment of the invention. Referring to FIG. 2, the slew rate control circuit 1000 includes, for example, but not limited to, a switch 1100 and an inverter 1200. A first end 1102 of the switch 1100 is coupled to a power terminal 1002. A toggle end 1104 of the switch 1100 is coupled to a first control terminal 1004. A second end 1106 of the switch is coupled to an output terminal 1006. An output end 1202 of the inverter 1200 is coupled to the output terminal 1006. An input end 1204 of the inverter 1200 is coupled to an input terminal 1008.

The power terminal 1002 may be coupled to the voltage source or the ground, that is, the first end 1102 of the switch 1100 may be coupled to the voltage source or the ground. Therefore, when the first end 1102 of the switch 1100 is coupled to the voltage source and a voltage variation occurring at the output terminal 1006 exceeds a predetermined voltage variation due to a voltage rise at the input end 1204 of the inverter 1200, a voltage at the first terminal 1004 conducts the switch 1100 to pull up the voltage at the output terminal 1006 so that the slew rate of the output terminal 1006 is controlled. The voltage variation refers to the amount that the voltage level changes in a period of time, for example, the voltage level changes at the output terminal 1006 from 30V to 10V in 10 nanoseconds(ns) so that the voltage variation is 2 V/ns. For simplicity, the voltage variation is regarded as the absolute value. The predetermined voltage variation may be any positive depending on the application of the slew rate control circuit. For example, if the voltage variation occurring at the output terminal 1006 is 2 V/ns and the predetermined voltage variation is 1 V/ns, then the voltage variation occurring at the output terminal 1006 exceeds the predetermined voltage variation, and therefore the switch 1102 is conducted to pull up the voltage at the output terminal 1006 so that the slew rate of the output terminal 1006 is controlled.

On the other hand, when the first end 1102 of the switch 1100 is coupled to the ground and a voltage variation occurring at the output terminal 1006 exceeds a predetermined voltage variation due to a voltage drop at the input end 1204 of the inverter 1200, a voltage at the first terminal 1004 conducts the switch 1100 to pull down the voltage at the output terminal 1006 so that the slew rate of the output terminal 1006 is controlled. The predetermined voltage variation may be any positive depending on the application of the slew rate control circuit. For example, the voltage level changes at the output terminal 1006 from 10V to 30V in 10 nanoseconds(ns) so that the voltage variation is 2V/ns. For example, if the voltage variation occurring at the output terminal 1006 is 2 V/ns and the predetermined voltage variation is 1 V/ns, then the voltage variation occurring at the output terminal 1006 exceeds the predetermined voltage variation, and therefore the switch 1102 is conducted to pull down the voltage at the output terminal 1006 so that the slew rate of the output terminal 1006 is controlled.

Figure 3:
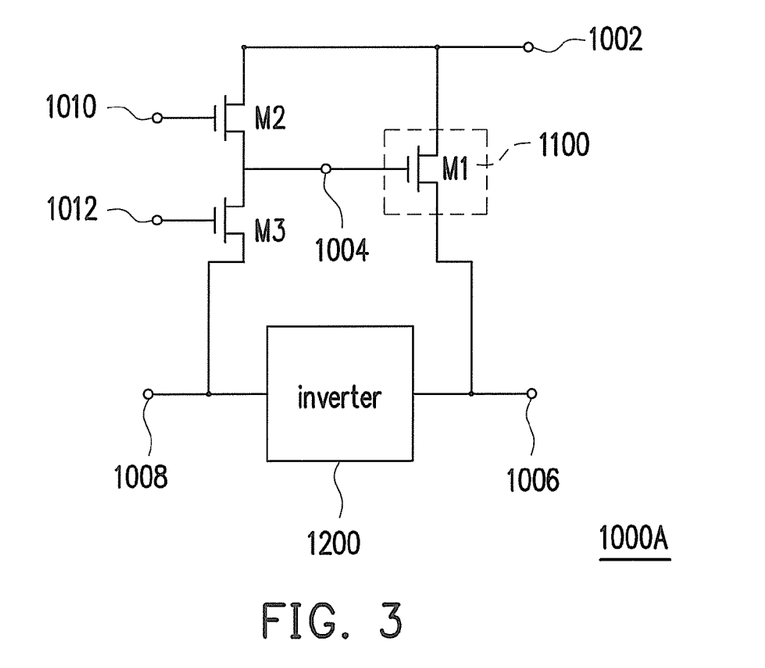
FIG. 3 shows another block diagram of a slew rate control circuit according to the embodiment of the invention.

FIG. 3 shows another block diagram of a slew rate control circuit according to the embodiment of the invention. Referring to FIG. 3, the slew rate control circuit 1000A includes a switch 1100, an inverter 1200, two transistors M2, M3. The switch 1100 includes a transistor M1. The connectivity in the slew rate control circuit 1000A similar to that in the slew rate control circuit 1000 is not repeatedly described, but the additional transistors M2, M3 are introduced below.

The source, the gate and the drain of the transistor M1 are respectively coupled to the power terminal 1002, the first control terminal 1004 and the output terminal 1006. The source, the gate and the drain of the transistor M2 are respectively coupled to the power terminal 1002, a second control terminal 1010 and the first control terminal 1004. The source, the gate and the drain of the transistor M3 are respectively coupled to the first control terminal 1004, a third control terminal 1012 and the input terminal 1008. With the proper configuration of the timing of the voltages at the second control terminal 1010, the third control terminal 1012 and the power terminal 1002, a voltage at the first terminal 1004 conducts the switch 1100 (transistor M1) to pull down or pull up the voltage at the output terminal 1006 so that the slew rate of the output terminal 1006 is controlled. It is noted that the transistors M1~M3 can be n-channel MOSFET or p-channel MOSFET and the power terminal 1002 can be coupled to the voltage source or the ground.

Figure 4:
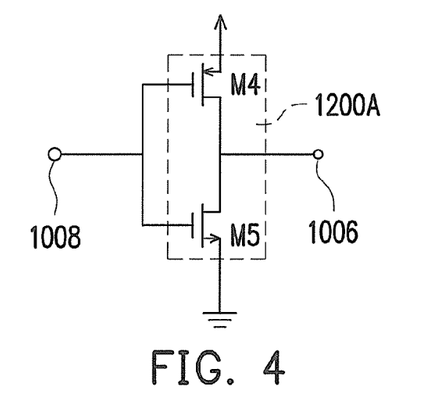
FIG. 4 shows a circuit diagram of an inverter in a slew rate control circuit according to the embodiment of the invention.

FIG. 4 shows a circuit diagram of an inverter in a slew rate control circuit according to the embodiment of the invention. Referring to FIG. 4, the inverter 1200A includes two transistors M4, M5. The source, the gate and the drain of the transistor M4 are respectively coupled to the voltage source, the input terminal 1008 and the output terminal 1006. The source, the gate and the drain of the transistor M5 are respectively coupled to the ground, the input terminal 1008 and the output terminal 1006. With proper configuration of the transistor size, the pull-up strength of the inverter 1200A may be equal to the pull-down strength of the inverter 1200A.

Figure 5:
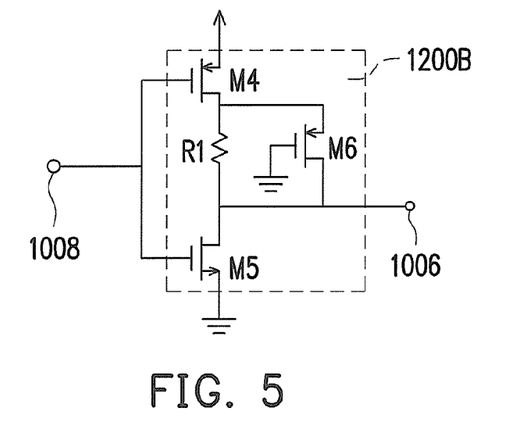
FIG. 5 shows another circuit diagram of an inverter in a slew rate control circuit according to the embodiment of the invention.

FIG. 5 shows another circuit diagram of an inverter in a slew rate control circuit according to the embodiment of the invention. Referring to FIG. 5, the inverter 1200B includes three transistors M4~M6 and a resistor R1. The source and the gate of the transistor M4 is coupled to the voltage source and the input terminal 1008. The source, the gate and the drain of the transistor M5 are respectively coupled to the ground, the input terminal 1008 and the output terminal 1006. The source, the gate and the drain of the transistor M6 are respectively coupled to the drain of the transistor M4, the ground and the output terminal 1006. The first end of the resistor R1 is coupled to a drain of the fourth transistor, and the second end of the resistor R1 is coupled to the output terminal 1006. The equivalent resistance at the drain of the transistor M5 may be smaller than that at the drain of the transistor M4 due to the resistor R1 and the transistor M6. Therefore, for the output terminal 1006, the pull-up strength of the inverter 1200B may be smaller than the pull-down strength of the inverter 1200B.

Figure 6:
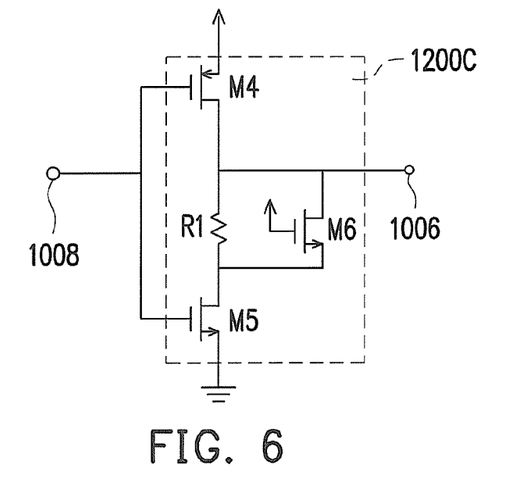
FIG. 6 shows another circuit diagram of an inverter in a slew rate control circuit according to the embodiment of the invention.

FIG. 6 shows another circuit diagram of an inverter in a slew rate control circuit according to the embodiment of the invention. Referring to FIG. 6, the inverter 1200C includes three transistors M4~M6 and a resistor R1. The source, the gate and the drain of the transistor M4 are respectively coupled to the voltage source, the input terminal 1008 and the output terminal 1006. The source and the gate of the transistor M5 are respectively coupled to the ground and the input terminal 1008. The source, the gate and the drain of the transistor M6 are respectively coupled to the drain of the transistor M5, the voltage source and the output terminal 1006. The first end of the resistor R1 is coupled to the output terminal 1006, and the second end of the resistor R1 is coupled to the drain of the transistor M5. The equivalent resistance at the drain of the transistor M4 may be smaller than that at the drain of the transistor M5 due to the resistor R1 and the transistor M6. Therefore, for the output terminal

1006, the pull-down strength of the inverter 1200C may be smaller than the pull-up strength of the inverter 1200C.

Figure 7:
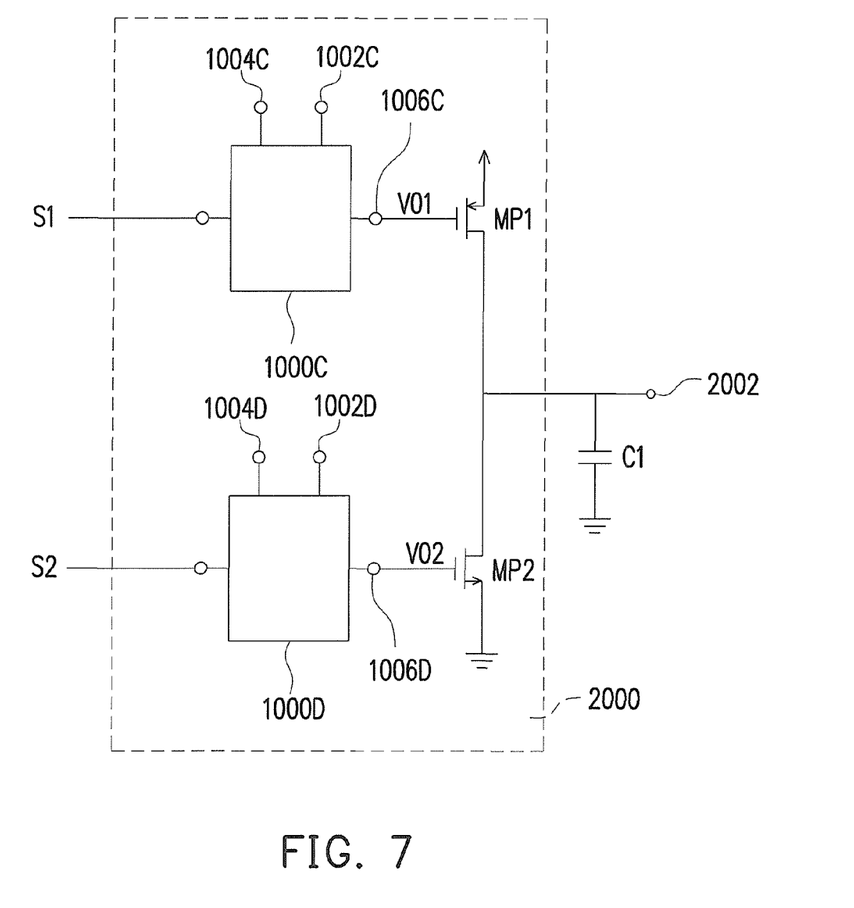
FIG. 7 shows a slew rate control device according to the embodiment of the invention.

FIG. 7 shows another slew rate control device according to the embodiment of the invention. The slew rate control device 2000 is adapted for an audio amplifier (not shown in FIG. 7). The slew rate control device 2000 is coupled to a capacitor C1 as a load. The slew rate control device 2000 includes two slew rate control circuits 1000C, 1000D, a detection circuit (not shown in FIG. 7), and two power transistor MP1, MP2. The two slew rate control circuits 1000C, 1000D may be referred to one part of the pre-driver, and the two power transistor MP1, MP2 may be referred to one part of the power stage. The detection circuit detects whether the voltage variation is larger than a predetermined voltage variation, so as to generate the controls signals to the control terminals 1004C and 1004D. The slew rate control circuits 1000C, 1000D are similar to the slew rate control circuit 1000 in FIG. 2 and are not repeatedly described. The slew rate control circuits 1000C, 1000D respectively receive the pre-driving signal S1, S2. The first power transistor MP1 charges the capacitor C1 according to an output voltage VO1 of the first slew rate control circuit 1000C. The second power transistor MP2 discharges the capacitor C1 according to an output voltage VO2 of the second slew rate control circuit 1000D. Therefore, two slew rate control circuits 1000C, 1000D respectively control the output voltages VO1, VO2 so that two power transistors MP1, MP2 prevent outputting a voltage with power bouncing at the output terminal 2002 of the slew rate control device 2000.

Moreover, the power terminal 1002C of the first slew rate control circuit 1000C is coupled to the voltage source. A voltage at the first control terminal 1004C of the first slew rate control circuit 1000C conducts the switch (not shown) in the first slew rate control circuit 1000C to pull up the output voltage VO1 so that the output voltage VO1 is controlled and the power transistors MP1 is turned off when a voltage variation occurring at the output terminal 1006C exceeds a predetermined voltage variation. On the other hand, the power terminal 1002D of the second slew rate control circuit 1000D is coupled to the ground. A voltage at the first control terminal 1004D of the second slew rate control circuit 1000D conducts the switch (not shown) in the second slew rate control circuit 1000D to pull down the output voltage VO2 so that the output voltage VO2 is controlled and the power transistors MP2 is turned off when a voltage variation occurring at the output terminal 1006D exceeds a predetermined voltage variation. With such configuration of two power transistor MP1, MP2, two slew rate control circuits 1000C, 1000D respectively control the output voltages VO1, VO2. Two power transistors MP1, MP2 prevent outputting a voltage with power bouncing at the output terminal 2002 of the slew rate control device 2000.

Figure 8:
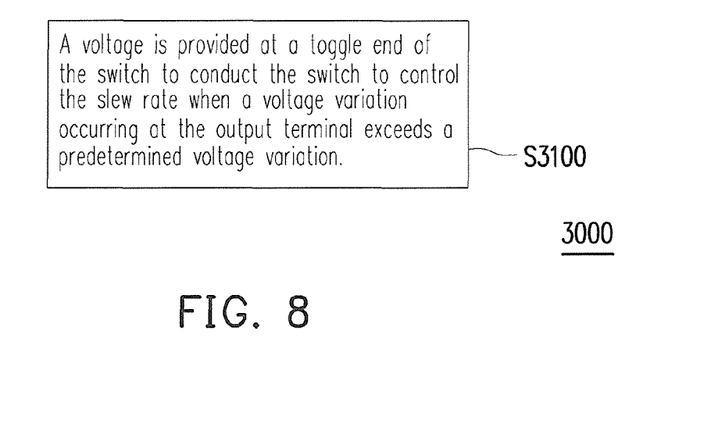
FIG. 8 shows a flow diagram of a method of controlling a slew rate with a slew rate control circuit according to the embodiment of the invention.

FIG. 8 shows a flow diagram of a method of controlling a slew rate with a slew rate control circuit according to the embodiment of the invention. The slew rate control circuit includes an inverter and at least one switch. The switch is coupled between a power terminal and an output terminal. An output end of the inverter is coupled to the output terminal. An input end of the inverter is coupled to an input terminal. The method 3000 of controlling a slew rate with a slew rate control circuit includes a step S3100. In the step S3100, a voltage is provided at a toggle end of the switch to conduct the switch to control the slew rate when a voltage variation occurring at the output terminal exceeds a predetermined voltage variation. The voltage variation refers to the amount that the voltage level changes in a period of time, for example, the voltage level changes at the output terminal from 30V to 10V in 10 nanoseconds(ns) so that the voltage variation is 2 V/ns. For simplicity, the voltage variation is regarded as the absolute value. The predetermined voltage variation may be any positive depending on the application of the slew rate control circuit. For example, if the voltage variation occurring at the output terminal is 2 V/ns and the predetermined voltage variation is 1 V/ns, then the voltage variation occurring at the output terminal exceeds the predetermined voltage variation.

Figure 9:
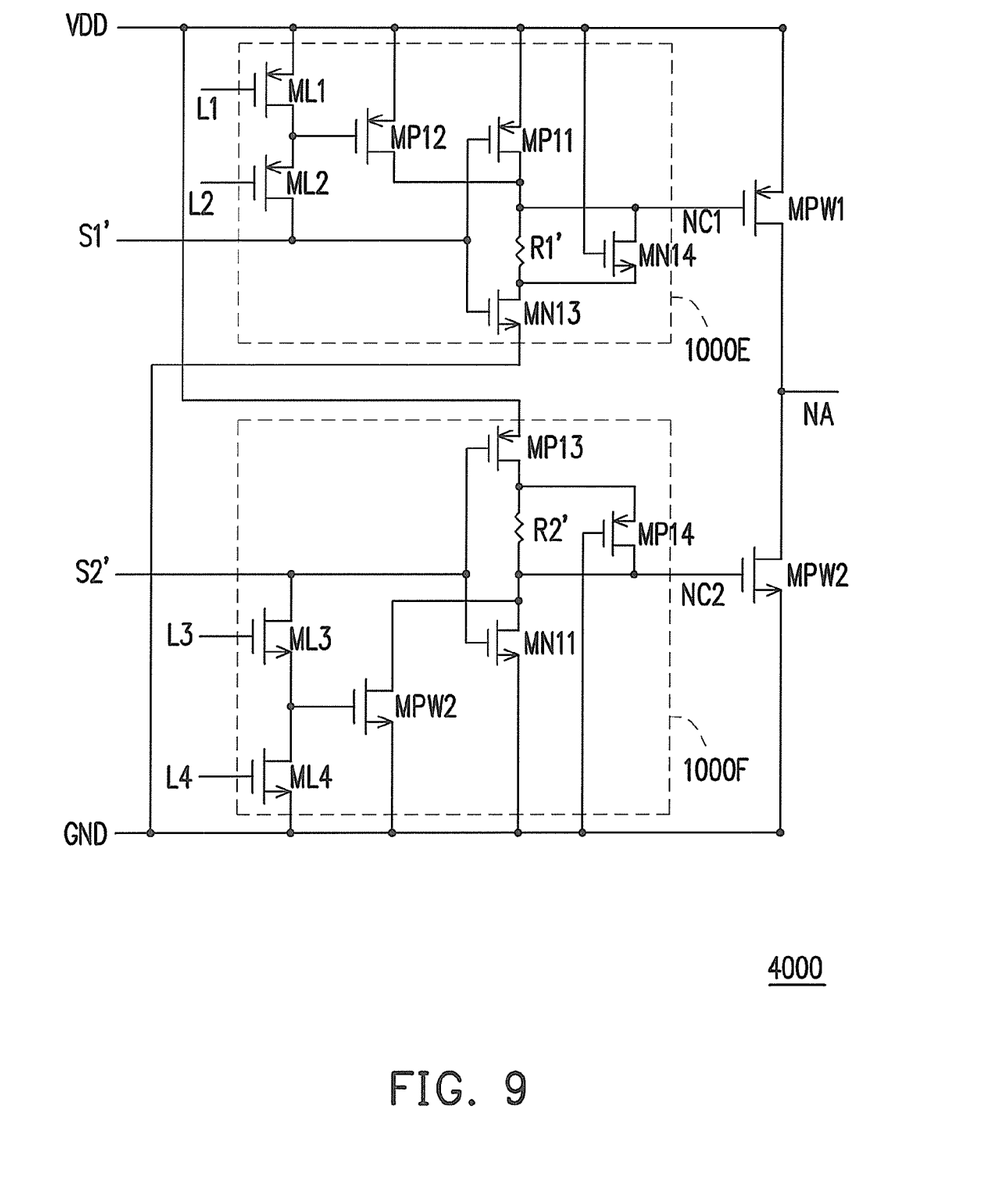
FIG. 9 shows another block diagram of a slew rate control device according to the embodiment of the invention.

FIG. 9 shows another block diagram of a slew rate control device according to the embodiment of the invention. Referring to FIG. 8, the slew rate control device 4000 includes a slew rate control circuit 1000E, a slew rate control circuit 1000F and two power transistors MPW1, MPW2. The slew rate control circuits 1000E, 1000F may be used as the pre-driver and the two power transistors MPW1, MPW2 may be used to drive a load, such as a speaker (not shown).

The slew rate control circuit 1000E includes transistors ML1, ML2, MP12, MP11, MN13, MN14 and a resistor R1'. The source and the drain of the transistor MP11 are respectively coupled to the voltage source VDD and the gate of the transistor MPW1. The gate of the transistor MP11 receivers the pre-driving signal S1'. The source and the gate of the transistor MN13 are respectively coupled to the ground GND and the gate of the transistor MP11. The source, the gate and the drain of the transistor MN14 are respectively coupled to the drain of the transistor MN13, the voltage source VDD and the drain of the transistor MP11. The first end of the resistor R1' is coupled to the drain of the transistor MP11, and the second end of the resistor R1 is coupled to the drain of the transistor MN13. The source of the transistor ML1 is respectively coupled to the voltage source VDD. The gate of the transistor ML1 receives a control signal L1. The source of the transistor ML2 is respectively coupled to the drain of the transistor ML1. The gate of the transistor ML2 receives a control signal L2. The source, the gate and the drain of the transistor MP12 are respectively coupled to the voltage source VDD, the drain of the transistor ML1 and the drain of the transistor MP11.

The configuration and connectivity of the slew rate control circuit 1000E and the slew rate control circuit 1000F are symmetric and similar, so that the configuration and connectivity of the slew rate control circuit 1000F is not repeatedly described herein. For convenience, the drain of the transistors MP11 is denoted as the node NC1, and the drain of the transistors MN11 is denoted as the node NC2.

The source and the gate of the transistor MPW1 are respectively coupled to the voltage source VDD, the drain of the transistor MP11. The source and the gate of the transistor MPW1 are respectively coupled to the ground GND, the drain of the transistor MN11. The drains of the transistors MPW1, MPW2 are coupled to each other and may be coupled to the speaker. For convenience, the drains of the transistors MPW1, MPW2 are denoted as the node NA.

It is noted that in the slew rate control device 4000, the speed of turning off the transistor MPW1 mainly depends on the transistors MP11 and MP12, while the speed of turning off the transistor MPW2 mainly depends on the transistors MN11 and MN12.

In the embodiment, the time for turning on or turning off the transistor MPW1 is adjusted by changing the resistance from the node NC1 to the voltage source VDD. In normal operation, the transistors MP11 and MP12 are turned on to drive the transistor MPW1. When a current variation occurring from the node NA to the speaker (not shown) exceeds a predetermined current variation, such as a current from 10 mA to 100 mA in 10 ns, the transistor ML1~ML2 which are used for logic control turns off the transistors MP12. Thus, only the transistors MP11 is turned on to drive and then turn off the transistor MPW1. The resistance from the node NC1 to the voltage source VDD is less than that when the transistors MP11 and MP12 are both turned on. Therefore, the slew rate of current from the node NA to the speaker is reduced.

On the other hand, the time for turning on or turning off the transistor MPW2 is adjusted by changing the resistance from the node NC2 to the ground GND. In normal operation, the transistors MN11 and MN12 are turned on to drive the transistor MPW2. When a current variation occurring from the node NA to the speaker (not shown) exceeds a predetermined current variation, such as a current from 100 mA to 10 mA in 10 ns, the transistors ML3~ML4 which are used for logic control turns off the transistors MN12. Thus, only the transistors MN11 is turned on to drive and then turn off the transistor MPW2. The resistance from the node NC2 to the ground GND is less than that when the transistors MN11 and MN12 are both turned on. Therefore, the slew rate of current from the node NA to the speaker is reduced.

In brief, when a current variation occurring from the node NA to the speaker (not shown) exceeds a predetermined current variation, such as a current from 10 mA to 100 mA in 10 ns, the transistor MP12 to be switched and the transistors ML1~ML2 for logic control are used for changing the resistance from the node NC1 to the voltage source VDD such that the transistor MPW1 is turned off and the slew rate of current from the node NA to the speaker is reduced. In addition, when a current variation occurring from the node NA to the speaker (not shown) exceeds a predetermined current variation, such as a current from 100 mA to 10 mA in 10 ns, the transistor MN12 to be switched and the transistors ML3~ML4 for logic control are used for changing the resistance from the node NC2 to the ground GND such that the transistor MPW2 is turned off and the slew rate of current from the node NA to the speaker is reduced.

In summary, when a voltage variation occurring at the output terminal exceeds a predetermined voltage variation due to a voltage rise at input end of the inverter, a voltage at the first terminal conducts the switch to pull up the voltage at the output terminal so that the slew rate of the output terminal is controlled. On the other hand, when a voltage variation occurring at the output terminal exceeds a predetermined voltage variation due to a voltage drop at the input end of the inverter, a voltage at the first terminal conducts the switch to pull down the voltage at the output terminal so that the slew rate of the output terminal is controlled. In addition, when a current variation occurring at a node to be detected exceeds a predetermined current variation, the slew rate control circuit turns off the corresponding transistor such that the slew rate of the current from the detected node to the load is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A slew rate control circuit, comprising:
    at least one switch, a first end of the switch is coupled to a power terminal, a toggle end of the switch is coupled to a first control terminal, a second end of the switch is directly connected to an output terminal; and
    an inverter, an output end of the inverter is directly connected to the output terminal, an input end of the inverter is coupled to an input terminal,
    wherein a voltage at the first control terminal conducts the switch to control the slew rate when a voltage variation occurring at the output terminal exceeds a predetermined voltage variation, and the voltage at the first control terminal is generated by detecting an amount of a voltage level change of the voltage at the output terminal during a period of time.

2. The slew rate control circuit of claim 1, wherein the switch comprises a first transistor, a source of the first transistor is coupled to the power terminal, a gate of the first transistor is coupled to the first control terminal, a drain of the first transistor is coupled to the output terminal.

3. The slew rate control circuit of claim 1, further comprising:
    a second transistor, a source of the second transistor is coupled to the power terminal, a gate of the second transistor is coupled to a second control terminal, a drain of the second transistor is coupled to the first control terminal; and
    a third transistor, a source of the third transistor is coupled to the first control terminal, a gate of the third transistor is coupled to a third control terminal, a drain of the third transistor is coupled to the input terminal.

4. The slew rate control circuit of claim 1, wherein the inverter comprises:
    a fourth transistor, a source of the fourth transistor is coupled to a voltage source, a gate of the fourth transistor is coupled to the input terminal, a drain of the fourth transistor is coupled to the output terminal; and
    a fifth transistor, a source of the fifth transistor is coupled to a ground, a gate of the fifth transistor is coupled to the input terminal, a drain of the fifth transistor is coupled to the output terminal.

5. The slew rate control circuit of claim 1, wherein the inverter comprises:
    a fourth transistor, a source of the fourth transistor is coupled to a voltage source, a gate of the fourth transistor is coupled to the input terminal;
    a fifth transistor, a source of the fifth transistor is coupled to a ground, a gate of the fifth transistor is coupled to the input terminal, a drain of the fifth transistor is coupled to the output terminal;
    a sixth transistor, a source of the sixth transistor is coupled to the drain of the fourth transistor, a gate of the sixth transistor is coupled to the ground, a drain of the sixth transistor is coupled to the output terminal; and
    a resistor, a first end of the resistor is coupled to a drain of the fourth transistor, a second end of the resistor is coupled to the output terminal.

6. The slew rate control circuit of claim 1, wherein the inverter comprises:
    a fourth transistor, a source of the fourth transistor is coupled to a voltage source, a gate of the fourth transistor is coupled to the input terminal, a drain of the fourth transistor is coupled to the output terminal;
    a fifth transistor, a source of the fifth transistor is coupled to a ground, a gate of the fifth transistor is coupled to the input terminal;
    a sixth transistor, a source of the sixth transistor is coupled to the drain of the fifth transistor, the gate of the sixth transistor is coupled to the voltage source, a drain of the sixth transistor is coupled to the output terminal; and
    a resistor, a first end of the resistor is coupled to the output terminal, a second end of the resistor is coupled to the drain of the fifth transistor.

7. The slew rate control circuit of claim 1, wherein the power terminal is coupled to the voltage source or the ground.

8. A method of controlling a slew rate with a slew rate control circuit comprising an inverter and at least one switch, wherein the switch is coupled between a power terminal and an output terminal directly, an output end of the inverter is coupled to the output terminal, an input end of the inverter is coupled to an input terminal, and the method comprises:

providing a voltage at a toggle end of the switch to conduct the switch to control the slew rate when a voltage variation occurring at the output terminal exceeds a predetermined voltage variation, and the voltage at the toggle end is generated by detecting an amount of a voltage level change of the voltage at the output terminal during a period of time.

9. A slew rate control device, comprising:

a first and second slew rate control circuits, each of the first and second slew control circuits comprises:

at least one switch, a first end of the switch is coupled to a power terminal, a toggle end of the switch is coupled to a first control terminal, a second end of the switch is directly connected to an output terminal; and an inverter, an output end of the inverter is directly connected to the output terminal, an input end of the inverter is coupled to an input terminal, wherein a voltage at the first control terminal conducts the switch to control the slew rate when a voltage variation occurring at the output terminal exceeds a predetermined voltage variation, and wherein the power terminal of the first slew rate control circuit is coupled to a voltage source, and the power terminal of the second slew rate control circuit is coupled to ground, the voltage at the first control terminal is generated by detecting an amount of a voltage level change of the voltage at the output terminal during a period of time;

a first power transistor, charging a load according to an output voltage of the first slew rate control circuit; and a second power transistor, discharging the load according to an output voltage of the second slew rate control circuit.

10. The slew rate control device of claim 9, wherein the switch comprising a first transistor, a source of the first transistor is coupled to the power terminal, a gate of the first transistor is coupled to the first control terminal, a drain of the first transistor is coupled to the output terminal.

* * * * *